(12) United States Patent
Schmidgall et al.

(10) Patent No.: US 7,766,669 B2
(45) Date of Patent: Aug. 3, 2010

(54) COMPRESSION CONNECTOR WITH COMPRESSING, MOUNTING AND LOCKING ASSEMBLIES

(75) Inventors: David Schmidgall, Wood Dale, IL (US); Javier Resendez, Streamwood, IL (US)

(73) Assignee: Molex Incorporated, Lisle, IL (US)

( * ) Notice: Subject to any disclaimer, the term of this patent is extended or adjusted under 35 U.S.C. 154(b) by 145 days.

(21) Appl. No.: 12/109,160

(22) Filed: Apr. 24, 2008

(65) Prior Publication Data

US 2009/0269949 A1 Oct. 29, 2009

(51) Int. Cl.
*H01R 12/00* (2006.01)
*H05K 1/00* (2006.01)
(52) U.S. Cl. .......................... 439/67; 439/77; 439/493
(58) Field of Classification Search ................ 439/67, 439/77, 493, 267, 343, 342, 262, 261, 372
See application file for complete search history.

(56) References Cited

U.S. PATENT DOCUMENTS

| 4,695,258 | A | * | 9/1987 | Hanson et al. | 439/67 |
| 4,913,656 | A | * | 4/1990 | Gordon et al. | 439/67 |
| 5,954,536 | A | * | 9/1999 | Fuerst et al. | 439/493 |
| 6,425,768 | B1 | * | 7/2002 | Taylor | 439/67 |
| 6,634,890 | B2 | * | 10/2003 | Peterson et al. | 439/67 |
| 7,144,256 | B2 | * | 12/2006 | Pabst et al. | 439/67 |

* cited by examiner

*Primary Examiner*—Hae Moon Hyeon
(74) *Attorney, Agent, or Firm*—Larry I. Golden

(57) ABSTRACT

Compression connectors and methods are provided that are suitable for mating a flat flexible circuit and a printed circuit board. A mounting assembly secures a locking compression assembly to the printed circuit board. Pliable compression springs mounted on rotatable levers engage the top surface of the flexible circuit and force the flexible circuit down onto an interposer, which in turn forces the interposer down onto the printed circuit board. Stop plates are biased towards the rotatable levers to hold the levers in the closed position. Latch members engage the stop plates to keep the connector closed.

28 Claims, 15 Drawing Sheets

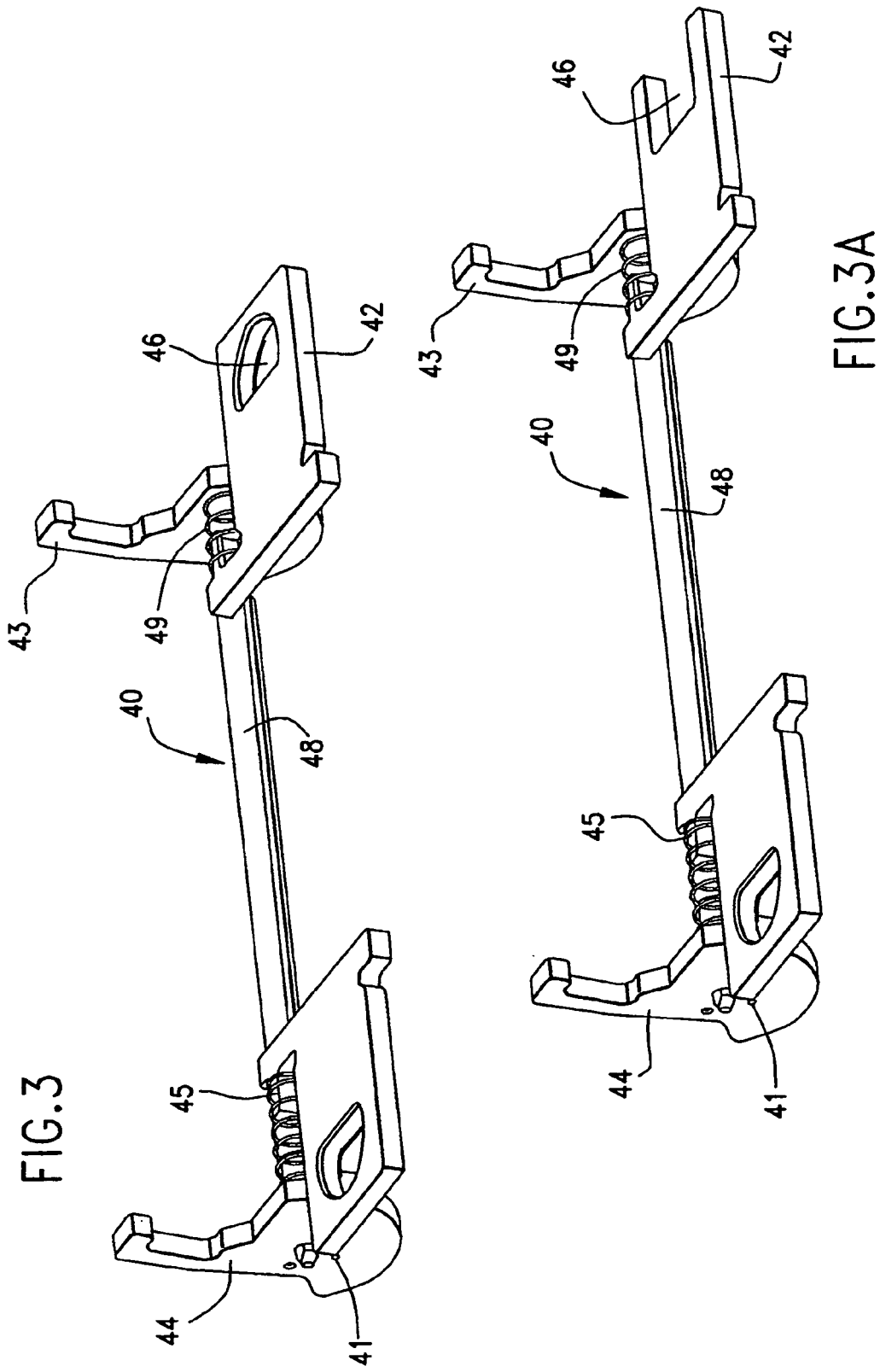

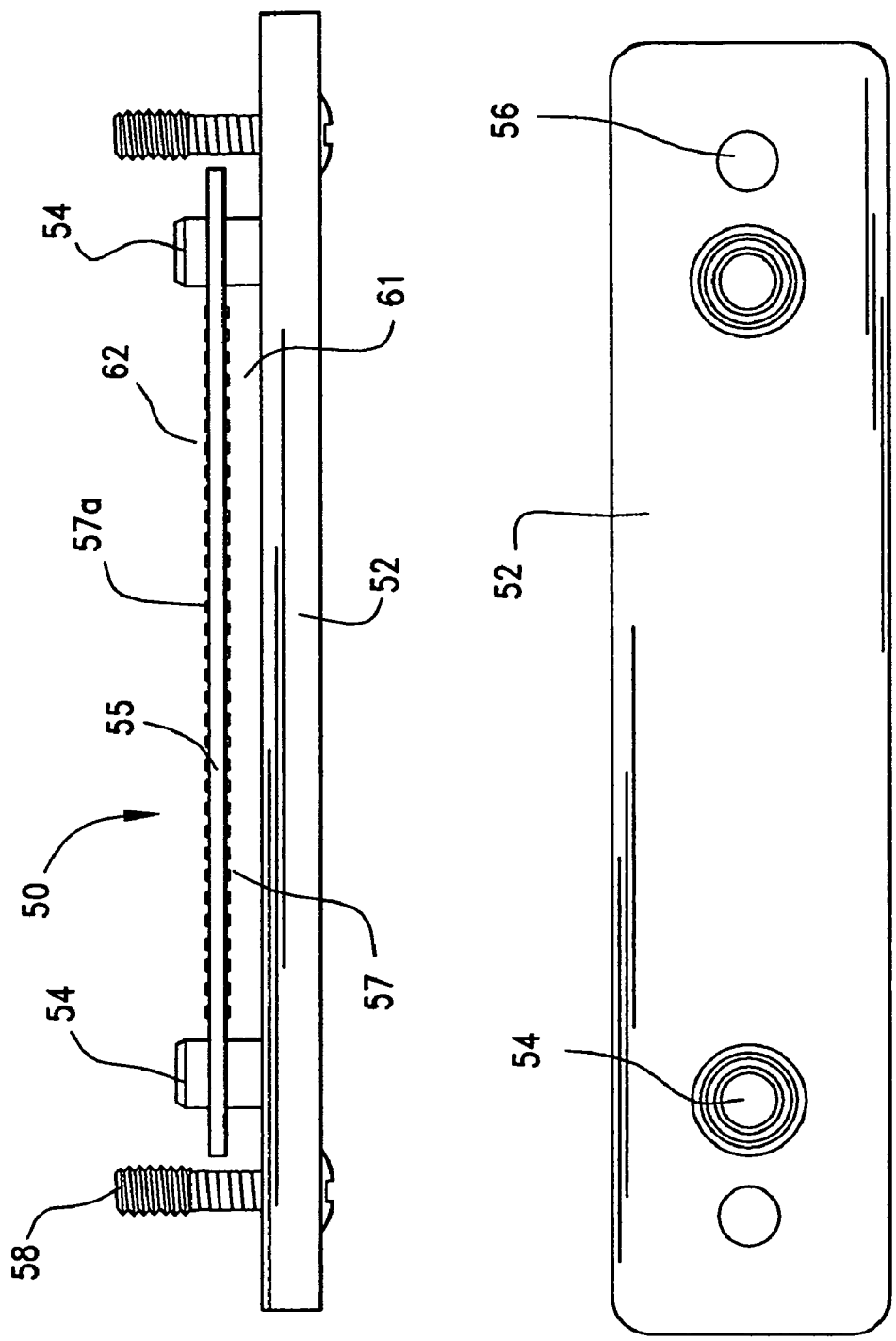

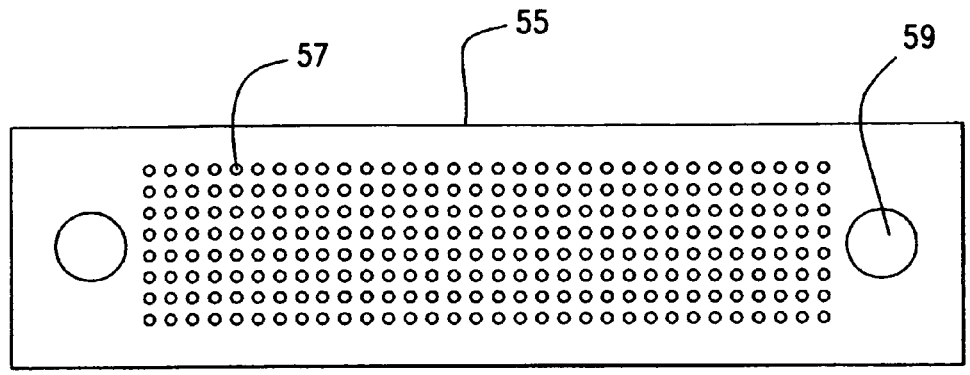
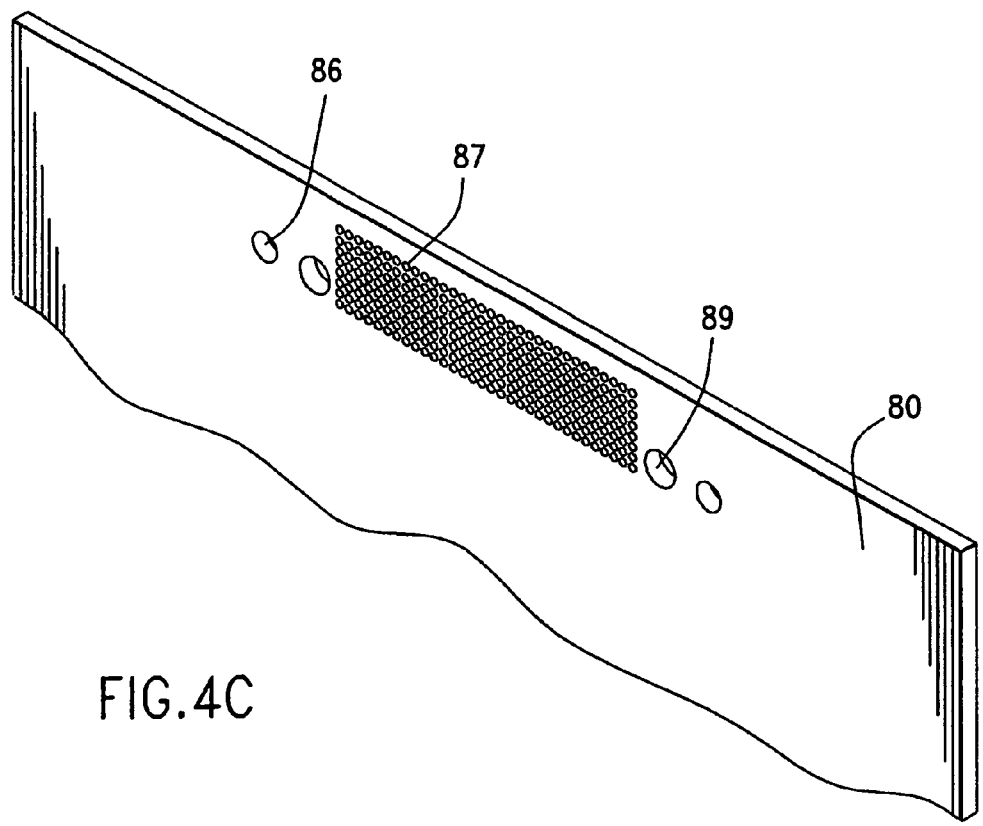

COMPRESSION CONNECTOR WITH COMPRESSING, MOUNTING AND LOCKING ASSEMBLIES

BACKGROUND OF THE INVENTION

This disclosure relates generally to a compression connector for connecting circuitry components together. The compression connector is especially well adapted for interposer connection uses. Such a compression connector can provide connections between rigid printed circuit boards and flexible circuits such as those in the form of flexible cables. It is generally known that such connections should be able to align a flexible circuit to achieve and provide a proper mechanical and electrical connection.

In previous prior art approaches, such connections have been accomplished by soldering or through the use of fastening hardware such as screws to provide a secure electrical connection. The present disclosure includes the realization that prior approaches could be improved upon if it were possible to avoid the use of loose hardware that can be lost, dropped or mishandled, while providing the ability for the connector to accommodate various circuit sizes with a minimal number of extra parts. Such hardware requires proper tightening to securely effect a proper electrical connection without damaging the flexible circuit from over tightening. Every subsequent disconnection and reconnection of the flexible circuit to a printed circuit board according to such previous approaches requires the use of appropriate tools, leading to increased expense for keeping the tools on hand and an increased expenditure of time as tools must be located for each use.

Goals have been arrived at in accordance with the approach of the present invention so as to provide proper alignment, mechanical connection and electrical connection, while providing a compression connection that does not require the use of separate tools and can be easily adapted to accommodate various size circuits. As a flexible circuit is mated with a printed circuit board, it is also important that the mating force be properly distributed and of sufficient force that a proper mechanical and electrical connection is made without damage to the components.

The invention also includes recognition that, in furtherance of these goals of the present approach, additional advantages could be attained if it were possible for multiple connections and disconnections to proceed with ease, in minimal time and without incorrect mating. Another recognition of the present approach is that it also would be desirable if the compression connection could be secured by a locking feature to prevent inadvertent disconnection of the flexible circuit due to vibration or other forces. Resolving how to provide proper rigidity to the connection to avoid deformation of the flexible circuit is also recognized as important in accordance with the approach of the present invention.

Prior art approaches that either have not recognized the positives that could be gained by seeking to achieve these types of objectives or that teach solutions other than those of the present approach include U.S. Pat. No. 5,733,151. This patent pertains to an electrical connection clamping device for use with a flexible medical electrode harness and is directed to an arrangement of springs that urge the clamping device to rest in a clamped position. To connect the printed circuits, the clamping arms must be raised and held open during insertion. This patent does not teach features that include rotatable compression levers that are lockable.

U.S. Pat. No. 6,017,244 pertains to an interconnection mechanism for electrically connecting flexible printed circuits. This patent is directed to an arrangement of clamping jaws that use a fastener such as a bolt with a locking washer to clamp the jaws on overlapping printed circuits. To disconnect the printed circuits by removing the clamps requires that the bolt be unfastened. This patent does not teach features for eliminating loose hardware or separate tools while achieving proper mechanical and electrical connection.

U.S. Pat. No. 6,036,502 pertains to a flexible circuit compression system that uses a compression mat having a plurality of resilient columns at preselected positions that correspond to conductive pads disposed on a rigid printed circuit board. The compression assembly is urged together with threaded bolts. This patent does not teach features that include rotatable compressor levers that are lockable.

U.S. Pat. No. 6,755,679 describes connecting a flexible circuit to housed contacts employing crimping pins and a rotatable flap. A tongue and groove combination is also used to restrain the flexible circuit. This patent does not teach features for using lockable rotatable levers with compression springs.

U.S. Pat. No. 6,780,046 describes connecting a principal flexible flat strip cable in a first housing to a branch flexible flat strip cable in a second housing. The two cables are compressed together by snapping and locking the two housings together. This patent does not teach features for using rotatable compression levers to connect flexible printed circuits to a rigid printed circuit board.

With the present approach, it has been determined that various characteristics of prior art, such as these patents, have shortcomings and undesirable attributes, results or effects. The present approach recognizes and addresses matters such as these to provide enhancements not heretofore available. Overall, the present approach provides a more fully enhanced result for compression connectors that connect flexible printed circuits with printed circuit boards.

SUMMARY OF THE INVENTION

An aspect or embodiment of the present approach or invention generally pertains to a compression connector assembly having a compression assembly, a locking assembly and a mounting assembly, which are mounted to a printed circuit board. The compression assembly includes at least one end block with an axial compression lever rod rotatably attached to the end block. Attached to the compression lever rod is a compression lever with a compressor spring member protruding therefrom. The locking assembly suitably includes a biased stop plate slidably mounted to the end block. A swing lock is rotatably attached to a lever stop rod. The locking assembly is mounted to the compression assembly, with the mounting assembly suitably including an interposer, a backer plate and fasteners. The fasteners protrude through apertures in the printed circuit board to engage the end block, thereby mounting the compression assembly to the printed circuit board. Alignment pins on the backer plate protrude through the printed circuit board, as well as through openings or slots within the interposer, flex circuit and hardboard.

In an embodiment a compression connector assembly suitably can house a flexible printed circuit. Alternatively, the interposer connection assembly can house a printed circuit board. Provided with the flexible printed circuit is a hardboard with alignment slots. Alignment slots of the hardboard each correspond with an alignment pin of the backer plate that protrudes through the printed circuit board. Utilizing a plurality of alignment pins in combination with a plurality of alignment slots in the hardboard provides for precise alignment of the flexible printed circuit with the interposer and the printed circuit board.

In accordance with another aspect or embodiment of the present approach or invention, the use of multiple properly sized polyurethane springs provides for evenly distributed force upon the flexible printed circuit as the flexible printed circuit is compressed between an interposer and a hardboard. This has been found to improve the integrity of the mechanical and electrical connections and to reduce the risk of damage to the flexible printed circuit. The occurrence of improper or damaged connections is thereby reduced, making for higher reliability and lower costs throughout the lifecycle of the connection assembly.

Further aspects or embodiments employ a compressor connector assembly with an interposer. At least one spring-loaded stop plate is slidably mounted to the end block and is biased towards a compression lever. In the open position, the compression lever impedes the movement of the spring-loaded stop plate. In the closed position, a portion of the compression lever no longer impedes the spring-loaded stop plate and the stop plate is urged inward until it engages a stop on the compression lever, thereby holding the compression lever down and preventing the compression lever from opening back up. This has been found to maintain a consistent force on the mating connection between the interposer and the flexible printed circuit. The occurrence of improper or damaged connections is thereby further reduced, making for higher reliability and lower costs throughout the lifecycle of the interposer connection assembly. Further, the stop on the compression lever is centered such that any given compression lever can be used on either side of the compression connector assembly. This allows for the compression lever to be a universal part, thereby lowering assembly complexity and costs. Alternatively, the stop on the compression lever can be located at any position that engages the stop plate.

In accordance with a further aspect or embodiment, swing locks can be rotatably attached to the lever stop rod of the compression connector. The swing locks engage an aperture in the spring loaded stop plates once the stop plates are in the biased or closed position. This engagement of the swing locks further prevents the compression levers from opening, even in the presence of vibration or failure of the stop compression spring. The swing locks have a lip that engages the stop plates when the swing locks are opened to define a fully opened position beyond which the swing locks are not able to rotate. Further, the swing locks have a protrusion on the inside surface facing the end blocks, wherein such protrusion is engaged within a cavity on the end block when the swing lock is in any position except the fully locked position. In the fully locked position, the protrusion on the swing lock engages the surface of the inside wall of the end block. This engaging force in the fully locked position prevents the swing lock from inadvertently opening, such as from vibration or gravity, as might occur when the compression connector assembly is oriented in an inverted position. Alternatively, a wave washer or an O-ring could be utilized between the end block and the swing lock. In addition, in this embodiment the swing locks are fixed to the stop lever rod such that the swing locks rotate in tandem, thereby ensuring that both compression levers and stop plates are fully engaged in the closed position before the swing locks can be engaged. This ensures that the compression force is evenly distributed and that both ends of the compression assembly with interposer are securely connected before the compression assembly with interposer can be locked, thereby improving reliability of the connection.

According to still another aspect or embodiment, a backer plate can be provided on the opposing side of the printed circuit board to provide rigidity and a suitable surface to engage the fasteners that are attached to the end blocks. The rigidity assists in providing for consistent force across the mating interface between desired components, such as an interposer and a flexible printed circuit, ensuring proper mechanical and electrical connection. A fastener-engaging surface, such as the illustrated backer plate, allows the fastener to attach to the end block using proper force without damaging the printed circuit board.

In accordance with a still further aspect or embodiment, receiving cavities are located on the bottom faces of the compression connector end blocks to capture an interposer when the end blocks are fastened to the backer plate, thereby preventing the interposer from lifting free of the engaged circuitry-containing component such as a printed circuit board. This allows the interposer to be held in a substantially fixed position without having to directly secure the interposer to the printed circuit board, thereby eliminating fastening materials and additional fastening steps in the assembly process. Elimination of materials and assembly steps results in reduced costs and improved efficiency.

In accordance with still another aspect or embodiment of the compression connector, compression levers are provided that have a rear lip that engages the stop lever rod when the compression levers are forced past the typical closed position when the printed circuit board is not attached. This prevents the compression levers from dropping down so far that the stops on the compression levers no longer inhibit the spring loaded stop plates from coming completely out of the end blocks. This also prevents the compression levers from being forced beyond a specific point in the closed position, thereby preventing excessive force from damaging the flexible circuit assembly.

According to still another aspect or embodiment, the compression lever rod is press fit into the end blocks of the compression connector. In addition, the stop lever rod is clearance fit to the end blocks and press fit into the swing locks. These features hold the compression assembly with interposer together and prevent the compression assembly and interposer from pulling apart or twisting during shipping, handling and assembly onto a printed circuit board.

According to yet another aspect or embodiment, an interposer connection assembly can be sized to handle various circuit lengths by simply varying the lengths of the compression lever rod, the lever stop rod and the backer plate. All of the other components remain the same for any length circuit that is used. This minimizes the number of parts that need to be manufactured and used, thereby cutting complexity and costs. Alternatively, for the largest circuits additional compression levers and compression springs can be used to provide an even distribution of force on the mating interface between the flex circuit, the interposer and the printed circuit board. This ensures proper mechanical and electrical connection, thereby improving reliability of the interposer connection assembly.

In accordance with still another aspect or embodiment, the end blocks of the compression connector have ramped grooves on side walls for receiving the locking protrusion on the swing locks. This allows any given end block to be used on either side of the compression assembly. This allows for the end block to be a universal part, thereby lowering complexity and costs. Alternatively, end blocks can have a groove or grooves on only one side such that a specific orientation is required of any given end block.

BRIEF DESCRIPTION OF THE DRAWINGS

FIG. 3 is a perspective view of a locking assembly;

FIG. 3A is a perspective view of another embodiment of a locking assembly;

FIG. 4 is a front elevation view of a mounting assembly;

FIG. 4A is a top plan view of a backer plate component of the mounting assembly of FIG. 4;

FIG. 4B is a top plan view of an interposer component of the mounting assembly of FIG. 4;

FIG. 4C is a perspective view of a cut away portion of a printed circuit board;

DETAILED DESCRIPTION OF THE ILLUSTRATED EMBODIMENTS

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner, including employing various features disclosed herein in combinations that might not be explicitly disclosed herein.

Figure 1:
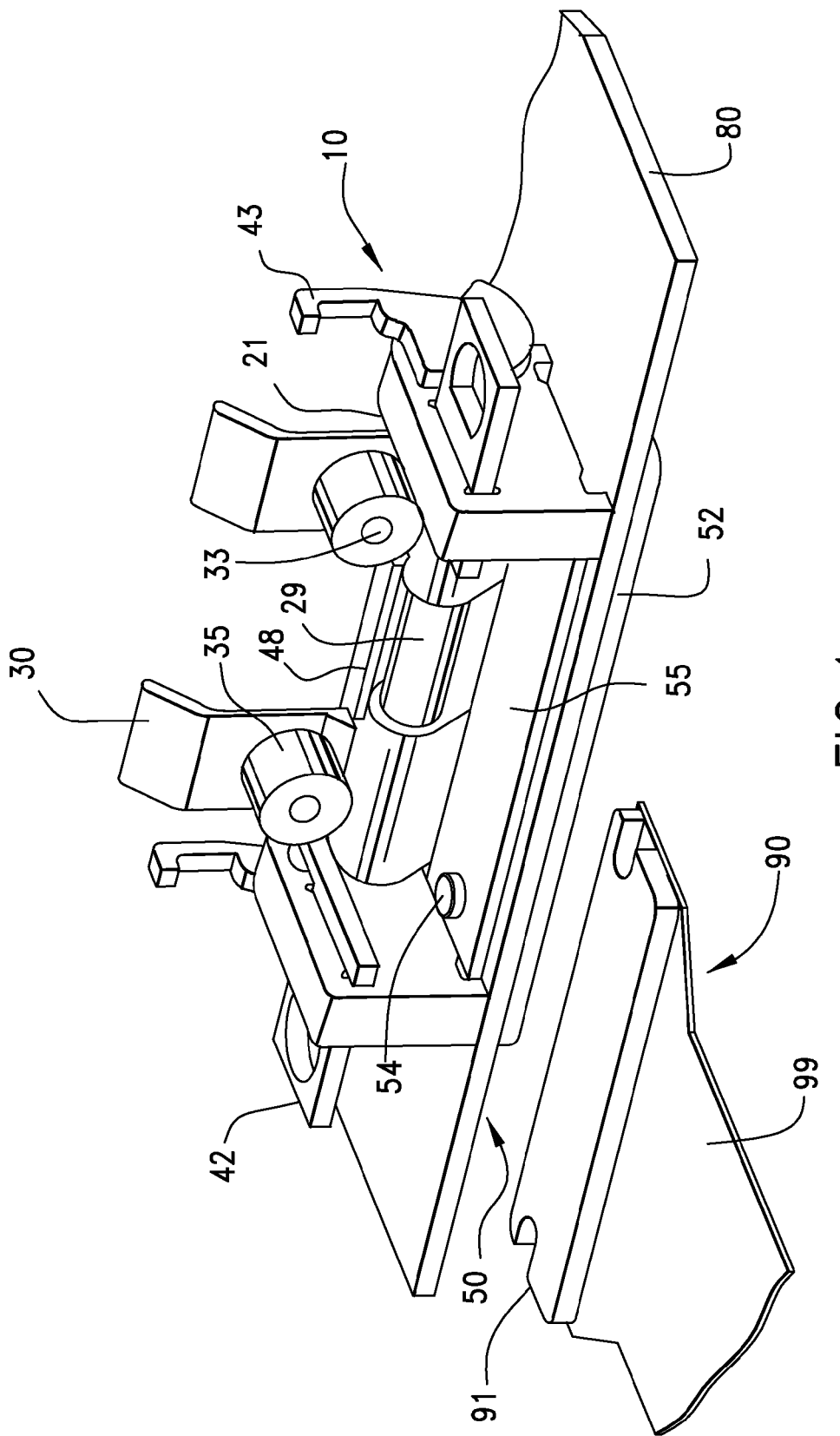
FIG. 1 is a perspective view of an unmated compression connector assembly in an open position and having an interposer located therein.

FIG. 1 illustrates an embodiment of this invention. A compression connection assembly generally shown as 10 is sized and shaped in order to suitably mate with a circuitry component 90. Compression connection assembly 10 is comprised of a compression assembly 20 (FIG. 2), a locking assembly 40 (FIG. 3) and a mounting assembly 50 (FIG. 4). Compression assembly 20 and mounting assembly 50 are suitably mounted to a mounting circuitry component 80, and an interposer 55 can be included when desired. Locking assembly 40 is suitably mounted to compression assembly 20. In some instances, the size of the compression connection assembly 10 can be varied to accommodate varying sized circuits. Suitable circuit sizes include, but are not limited to, 28 contacts to 700 contacts. Typical circuit sizes are in the range of 80 contacts to 504 contacts. In this example, the compression connection assembly 10 suitably includes a circuit with 256 contacts. A wide variety of circuit sizes are possible, depending upon the configuration needed for any of a variety of applications.

Figure 2:
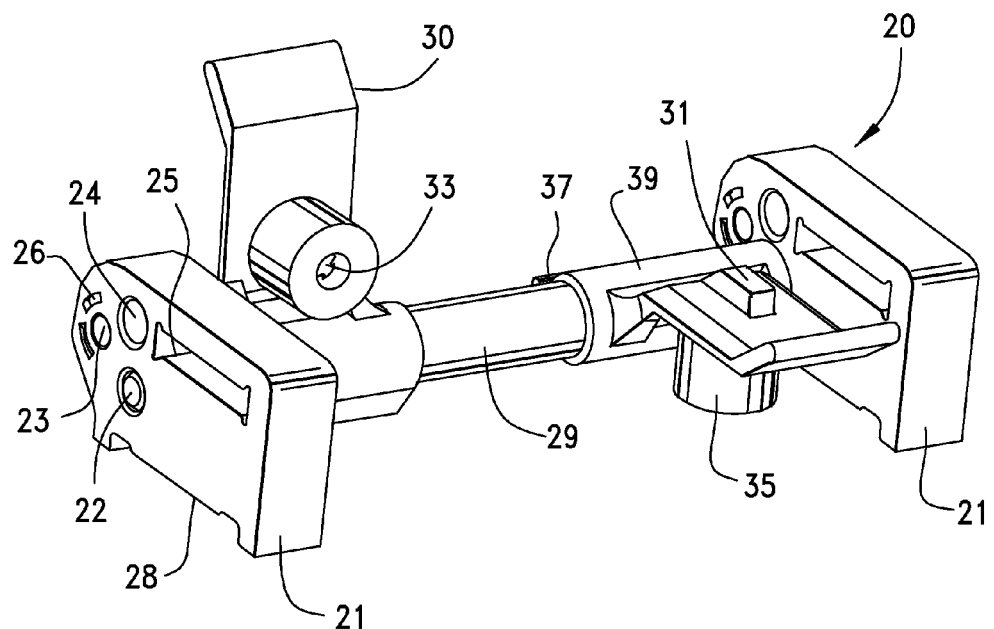
FIG. 2 is a perspective view of a compression assembly.
Figure 2A:
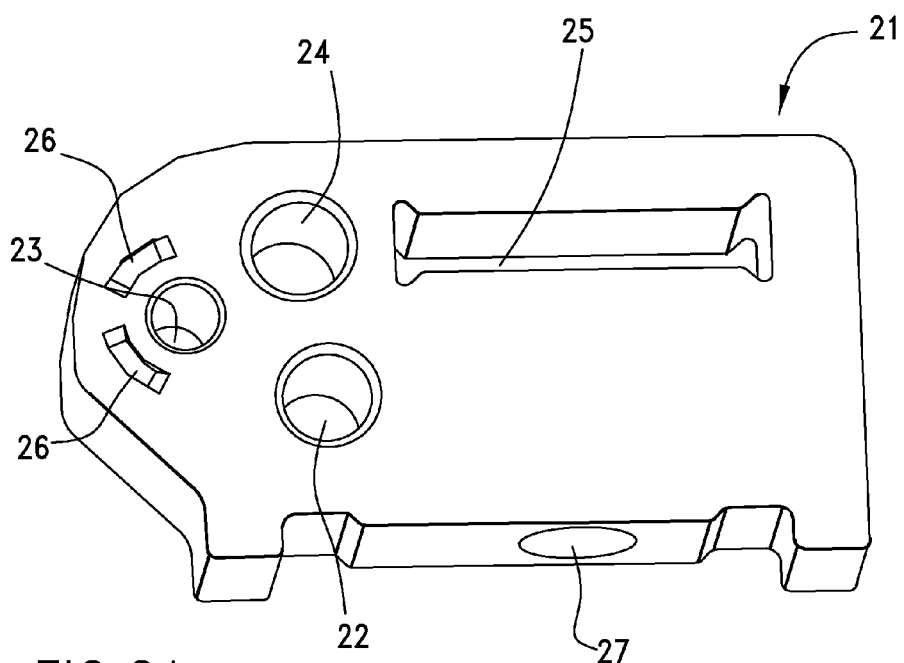
FIG. 2A is a perspective view of an end block.

As seen in FIG. 2, the compression assembly 20 includes a support, such as the illustrated end block 21. This illustrated embodiment of the compression assembly is comprised of spaced apart end blocks 21. Each support or end block 21 can be made of any rigid material, such as metal for example. The end block 21 can be produced by any acceptable manufacturing methods such as molding, machining or casting. In this embodiment, the end block 21 is made of zinc die cast. As seen in FIG. 2A, the end block 21 further includes receiving apertures such as a bore 22 for receiving a compression lever rod 29 (as shown in FIG. 2), an opening 23 for receiving a stop lever rod 48, a hole or bore 24 to receive a biasing member 49 in the form of a helical compression spring, a slot 25 to receive a stop plate 42, a protrusion-accommodation groove 26, and an assembly bore 27. The end block 21 may include a cavity 28 for accommodating an interposer 55 as noted herein.

The compression assembly 20 is further comprised of an axial compression lever rod 29. The compression lever rod 29 can be made of a rigid material, such as metal for example. In this particular example, the compression lever rod 29 is comprised of steel, a specific type being industry standard C4140 cold rolled steel. The compression lever rod 29 is attached to the end block or blocks 21 by inserting an end of the compression lever rod 29 into the end block bore 22. In this embodiment, the end block bore 22 is sized to engage the compression lever rod 29 in a friction fit when the end block 21 and the compression lever rod 29 are press fit together. Other assembly approaches can be practiced.

As seen in FIG. 2, the compression assembly 20 is further comprised of at least one compression spring 35, typically with a mounting member 30 for rotation as illustrated. In some embodiments, a pair of compression springs is provided as shown in FIG. 2, and more than two compression springs may be utilized, especially for wider circuit devices and/or interposers (see FIG. 14). The mounting member, such as the illustrated compression lever 30 is shown projecting from a collar 39 by which the compression lever 30 is mounted on the compression lever rod 29. Multiple mounting members or compression levers can project from a single collar, in which case the levers should lie substantially along the same plane.

When multiple collars 39 are used, each can be fixed to the compression lever rod 29 such that all compression levers 30 move in unison as the compression lever rod 29 is rotated. In the embodiment illustrated in FIG. 2, multiple collars 39 are provided, and each collar 39 is rotatably mounted separately onto the compression lever rod 29 such that each compression lever 30 rotates independently around the compression lever rod 29. The compression lever 30 typically is made of a rigid material, such as metal for example. The compression lever 30 can be formed by any manufacturing process such as machining, molding or casting. More specifically, in this illustrated embodiment, the compression levers 30 are made of zinc die cast.

The illustrated mounting member or compression lever 30 is further comprised of at least one stop 31 on an outside surface thereof. The stop 31 can be located substantially anywhere on an outside surface of the compression lever 30 such that a stop plate 42 (FIG. 3) of the locking assembly 40 is prevented from sliding completely out of the stop plate slot 25 in the end block 21. Although the stop 31 can be positioned at various locations on the compression lever 30, positioning the stop 31 at the lateral center of the compression lever 30 facilitates manufacture and assembly by allowing the compression lever 30 to be a universal part that can be used on either side of multiple-lever compression assembly 20.

In the illustrated embodiment, a compression spring 35 projects from an outside surface of the mounting member or compression lever 30. Compression spring 35 can be attached to its lever by a spring retention pin 33 using any suitable industry standard attachment process. In this embodiment, compression spring 35 is sized such that it engages the spring retention pin 33 with a friction fit. The compression spring 35 is made of pliable material, such as urethane for example. The Shore A scale rating of the compression spring 35 can be between about 30 durometers and about 120 durometers, typically between about 60 durometers and about 90 durometers. The deflection load rating can be between about 3 pounds and about 60 pounds, typically between about 10 pounds to about 40 pounds. The compression spring 35 can be formed by any standard manufacturing process such as molding or stamping.

The height and diameter of the compression spring 35 can be varied as needed. Generally, the ratio of height to diameter of the compression spring 35 will be between about 0.3 to 1 and about 2.2 to 1, typically between about 0.75 to 1 and about 1.25 to 1. For example, the height of the compression spring 35 can be between about 0.125 inch and about 0.375 inch, typically between about 0.187 inch and about 0.250 inch. Further, the diameter of each compression spring can be between about 0.170 inch and about 0.350 inch, typically between about 0.200 inch and about 0.250 inch.

The illustrated compression lever 30 further includes a stop lip 37. The stop lip 37 projects outward from the collar 39 such that the stop lip 37 engages the lever stop rod 48 (FIG. 3) when the compression lever 30 is attempted to be forced beyond an engagement angle "a" (FIG. 12A) below the plane parallel to the mounting circuitry component 80, which can be a printed circuit board for example. In a typical arrangement, the engagement angle "a" can be between 0 degrees and about 10 degrees, typically between about 1 degree and about 5 degrees. The engagement angle "a" is set such that the stop 31 is still able to engage the stop plate 42 when the compression lever 30 is forced as far towards the printed circuit board 80 as possible, due at least in part to the compressibility of the compression spring 35, thereby preventing the stop plate 42 from coming completely out of the slot 25.

Figure 14:
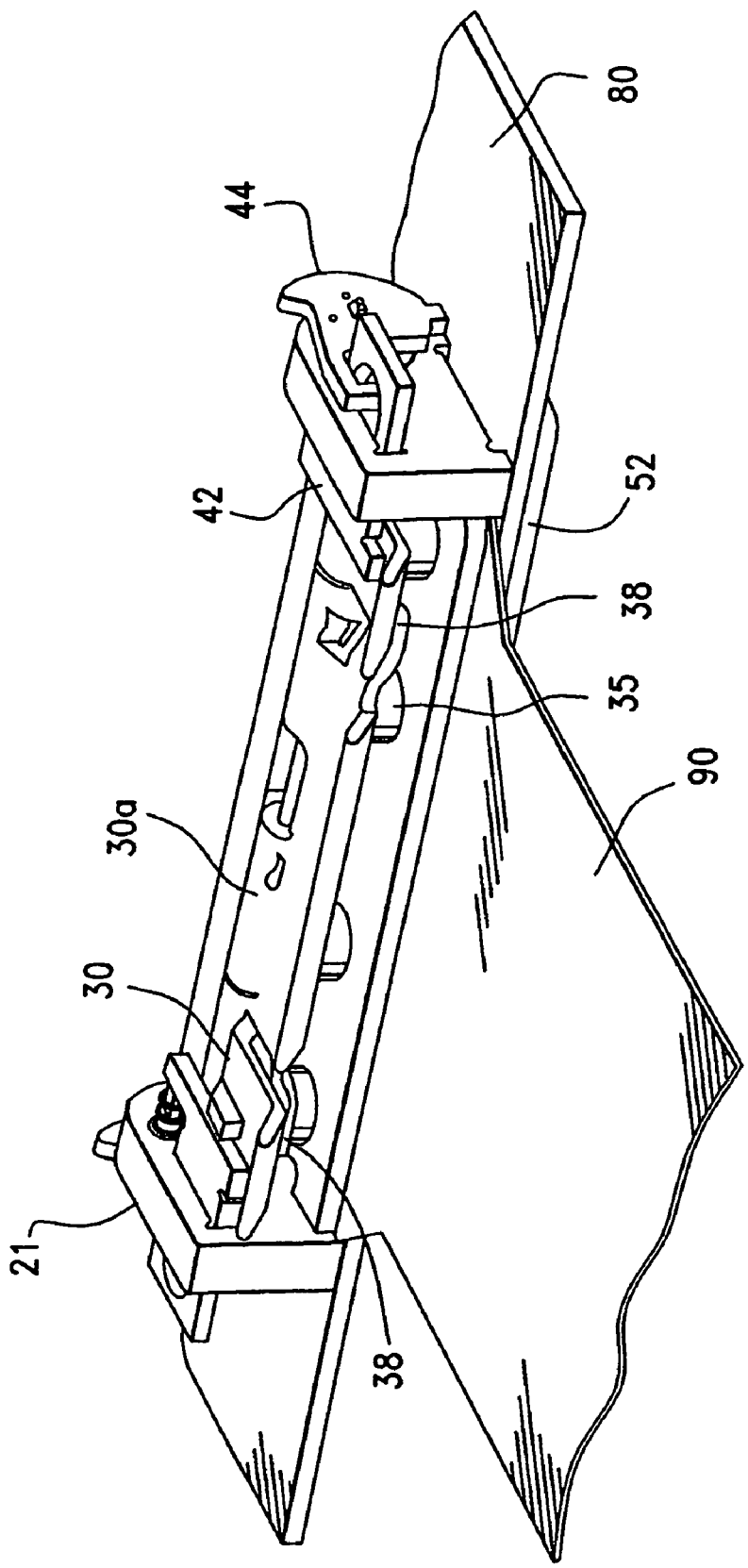
FIG. 14 is a perspective view of another embodiment of a mated compression connector assembly.
Figure 15:
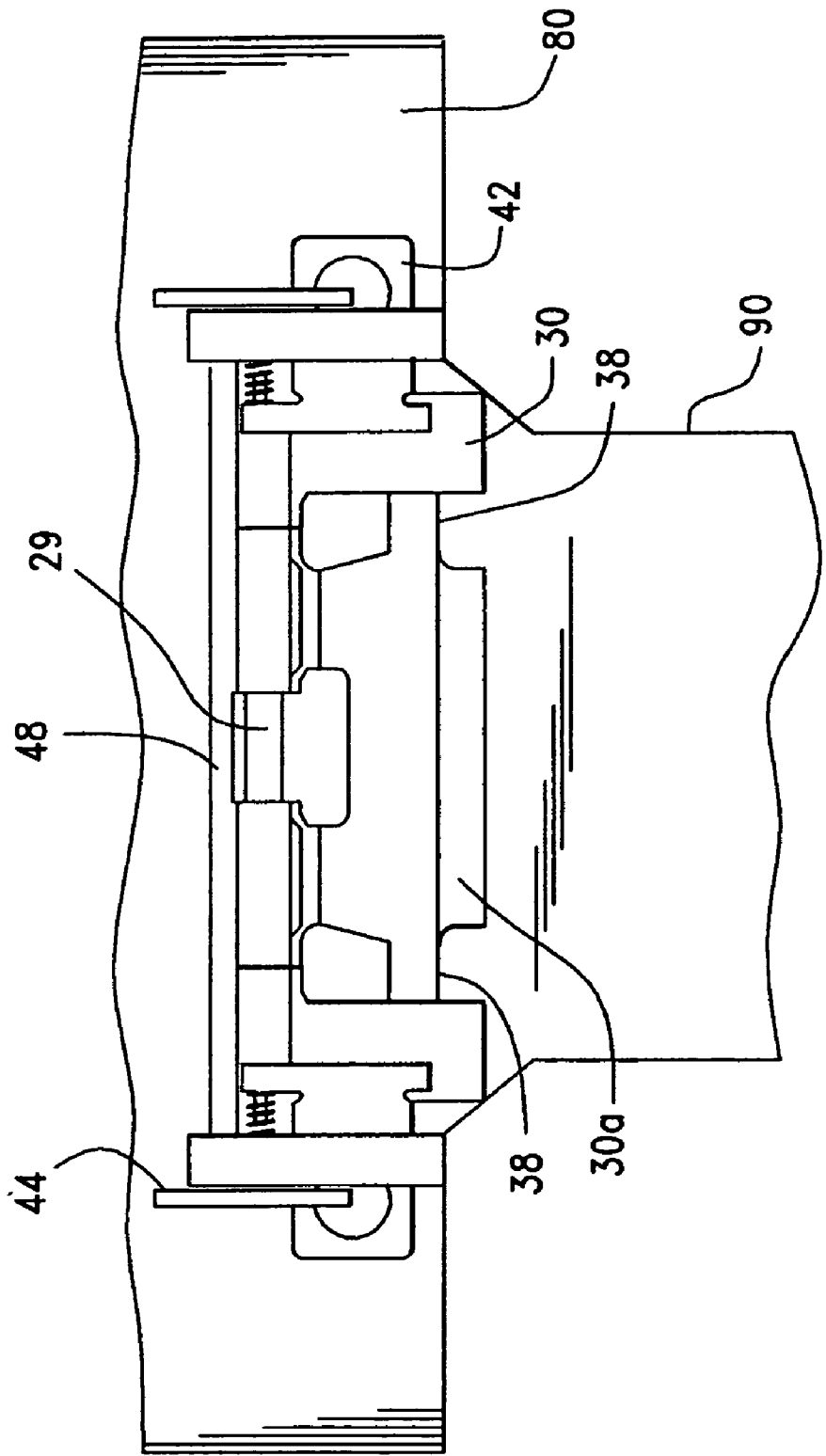
FIG. 15 is a top plan view of the mated compression connector assembly of FIG. 14.

In yet another embodiment as illustrated in FIGS. 14 and 15, a longer length circuit is used, which in this case is a circuitry having 504 contacts. In this illustrated example, a dependent compression lever 30a is located between two compression levers 30 and two compression springs 35 protrude from dependent compression lever 30a. In the illustrated embodiment, engaging tabs 38 extend out from each end of dependent compression levers 30a such that respective compression levers 30 engage the respective engaging tabs 38 when the compression levers 30 are rotated towards the closed position. When compression levers 30 are secured in a locked position, engagement tabs 38 are secured, thereby holding dependent compression lever 30a in a closed position as well under compression levers 30.

Figure 10:
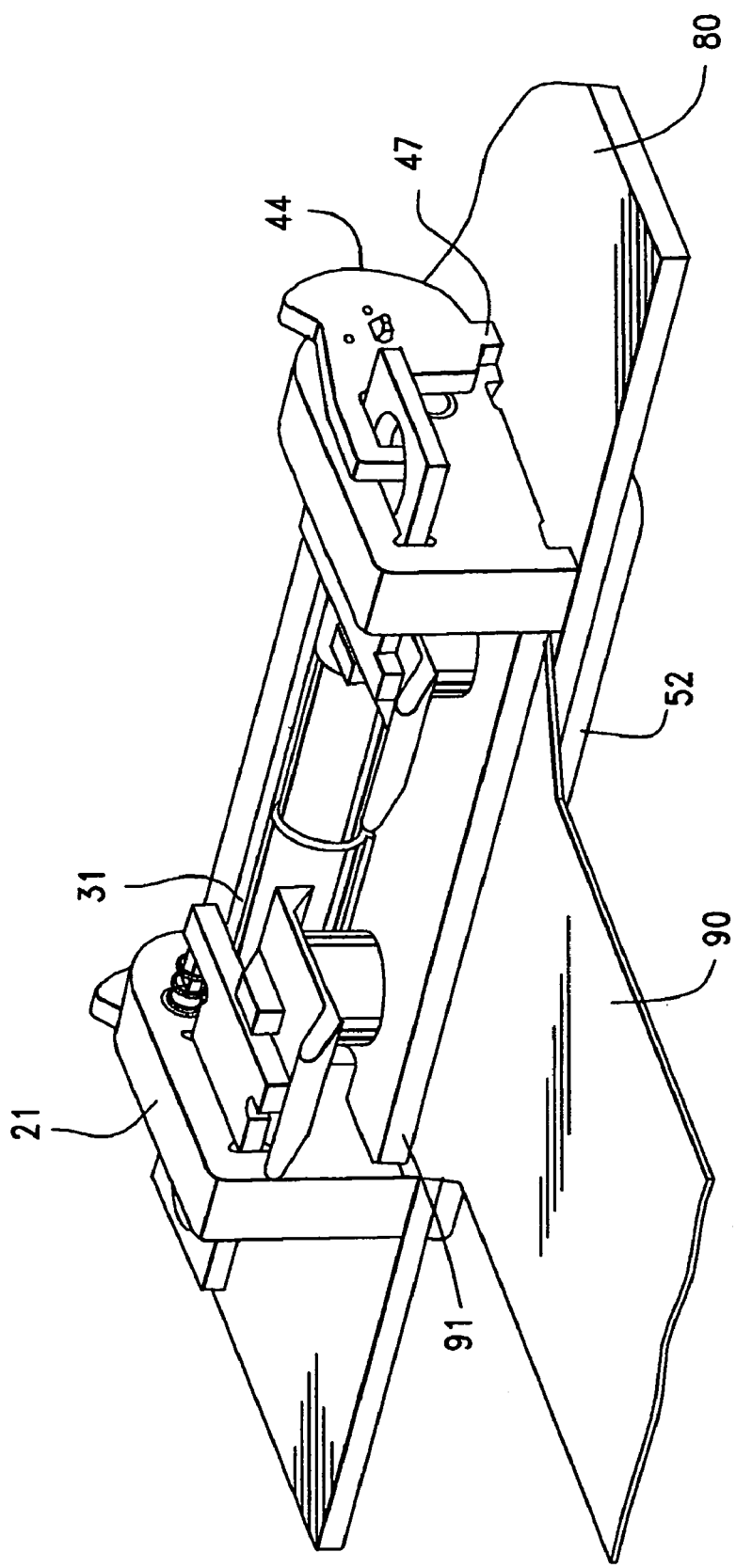
FIG. 10 is a perspective view of a mated compression connector assembly in a closed and locked position.
Figure 11:
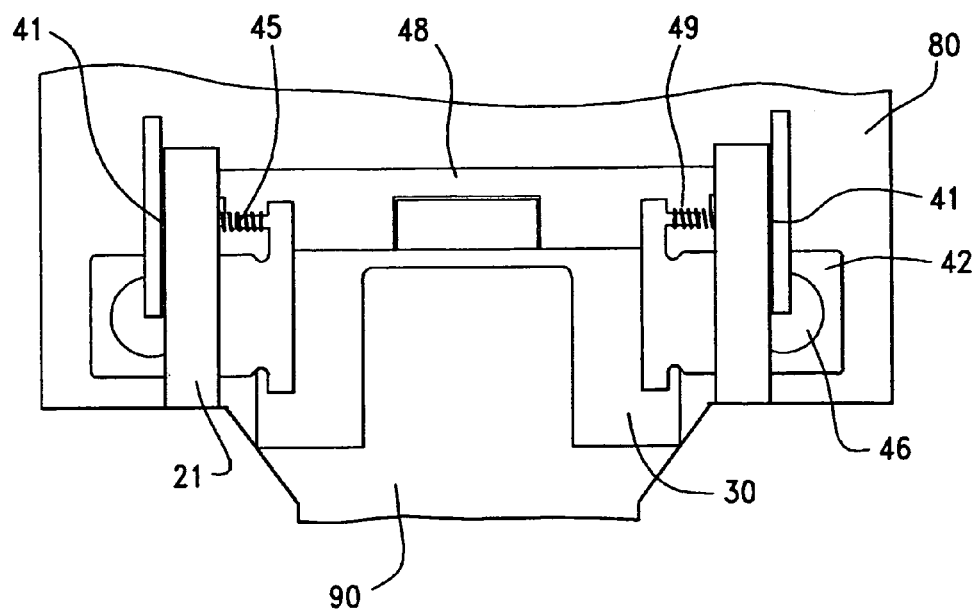
FIG. 11 is a top plan view of the mated compression connector assembly of FIG. 10.

As seen in FIG. 3, locking assembly 40 is comprised of at least one stop plate 42 that is slidably received in slot 25 (FIG. 2) of the end block 21. Each stop plate 42 is made of a rigid material, such as metal for example, and can be formed by any standard manufacturing process such as molding, casting, machining or stamping. In this embodiment, the stop plates 42 are stamped from steel, such as industry standard C4140 cold rolled steel. Each stop plate 42 further includes a retention pin 45 and a latch hole or open area 46. A biasing member 49 is retained on the retention pin 45 between a surface of stop plate 42 and a surface of swing lock 44, thereby urging the stop plate 42 inward toward the closed or locked position. The biasing member 49 can take the form of a spring such as the illustrated coil spring. When the stop plate 42 is in the locked or engaged position, the swing lock 44 is rotated so that the latch 43 engages with the latch hole 46 to affirmatively latch the stop plate in the locked position. (FIG. 10). Alternatively, open area 46 could be a slot or other open ended shape instead of a hole (FIG. 3A).

Figure 8:
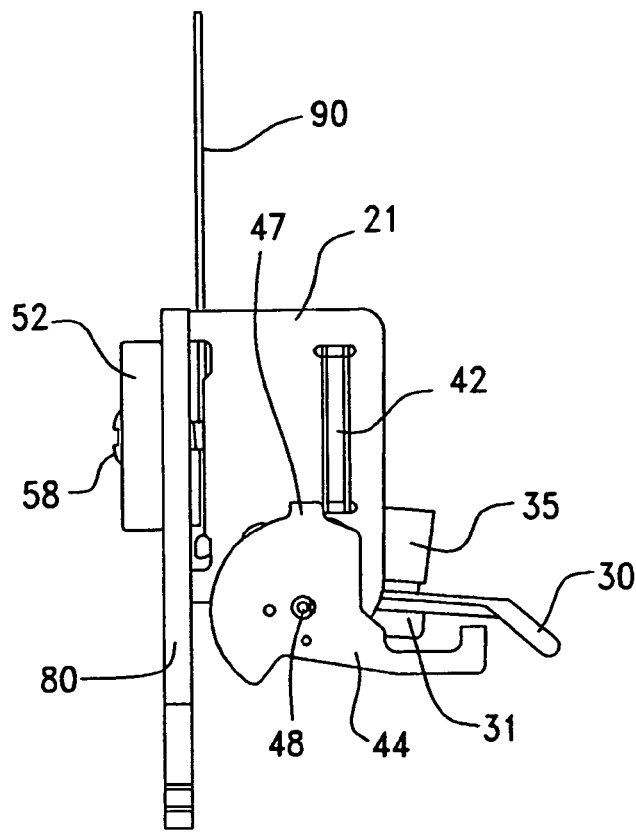
FIG. 8 is a side elevation view of the mated compression connector assembly of FIG. 6.
Figure 9:
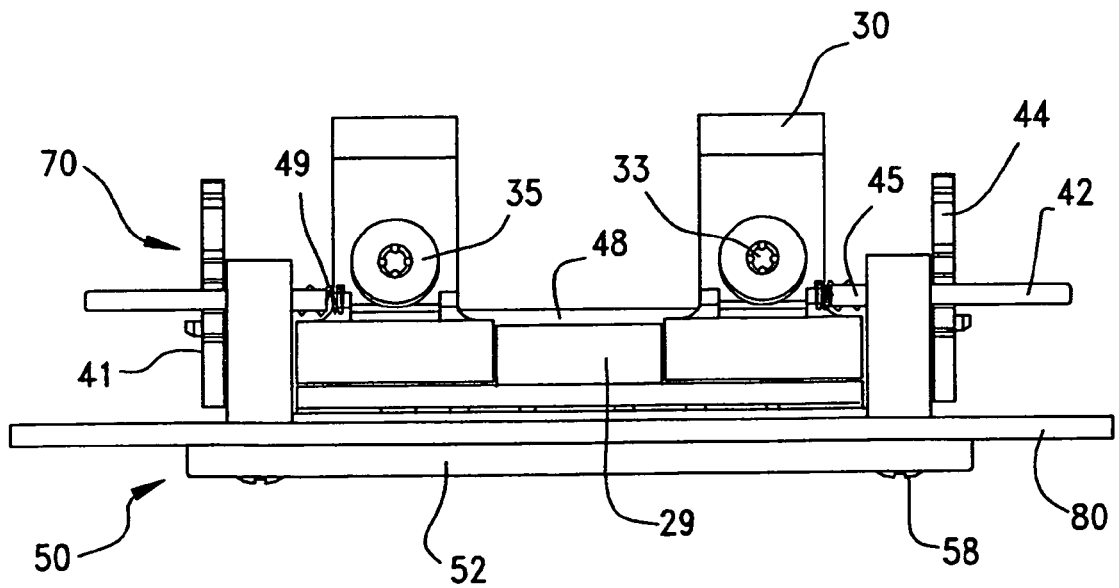
FIG. 9 is a front elevation view of the mated compression connector assembly of FIG. 6.

The locking assembly 40 may be further comprised of at least one locking member, such as the illustrated swing lock 44 rotatably or fixedly attached to a lever stop rod 48. In this embodiment, two locking members or swing locks 44 are fixedly attached to lever stop rod 48 such that the swing locks 44 move in unison. Each swing lock 44 is made of a rigid material, such as metal for example, and can be formed by any standard manufacturing process such as molding, casting, machining or stamping. In this embodiment, the swing locks 44 are stamped from steel such as industry standard C4140 cold rolled steel. The swing locks 44 are further comprised of latches 43, stop tabs 47 (FIG. 8) and locking protrusions 41 and 41a. The lever stop rod 48 is also made of a rigid material, such as metal for example. The lever stop rod 48 in this example is made of steel such as industry standard C4140 cold rolled steel.

Figure 13:
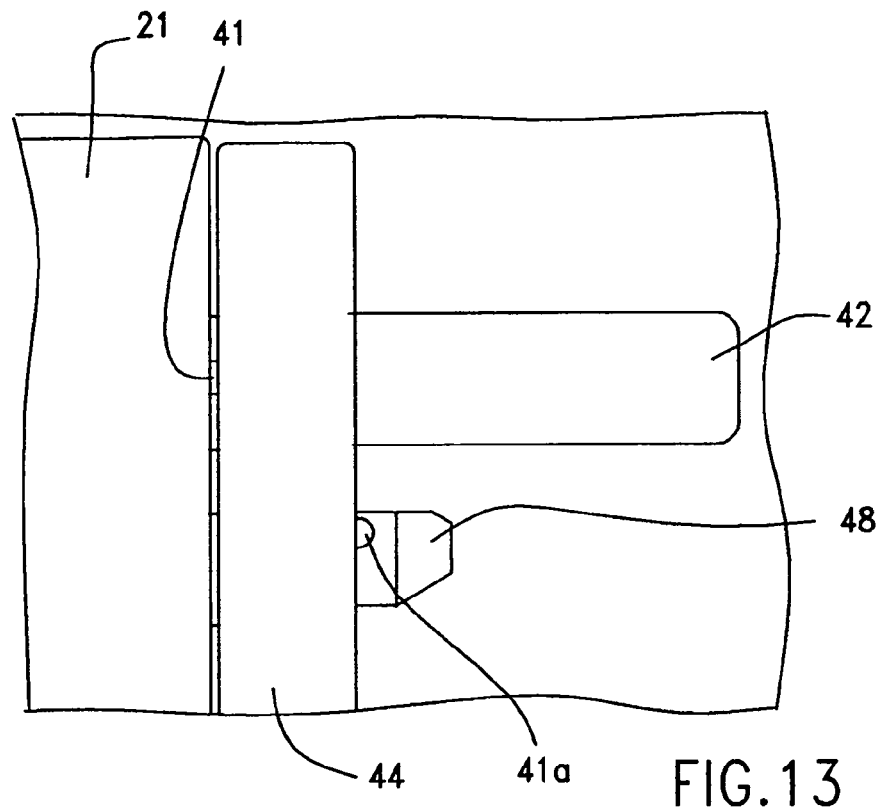
FIG. 13 is a front elevation view of a portion of the mated compression connector assembly of FIG. 10.

Securing the swing locks 44 can be facilitated by engagement between a location of the end block 21 and a location of the swing lock 44. These respective locations can take the form of opposing indents and/or detents or other surfaces that vary in spacing therebetween when the swing lock 44 rotates with respect to the end block 21. For example, locking protrusion 41 can reside within groove 26 on end block 21 when the swing lock 44 is in any open or unlocked position, but not when the swing lock 44 is in the closed or secured position. Multiple grooves can be provided to facilitate this action. When the swing lock 44 is rotated to the closed position according to this arrangement, the locking protrusion 41 rides up the ramped inner surface of groove or grooves 26 and becomes frictionally engaged with the outside surface of end block 21 in a secured position (FIG. 13). When desired, a stop tab 47 can be provided to engage the stop plate 42 when the swing lock 44 is rotated to the most open position, preventing the swing lock 44 from rotating further.

Figure 5:
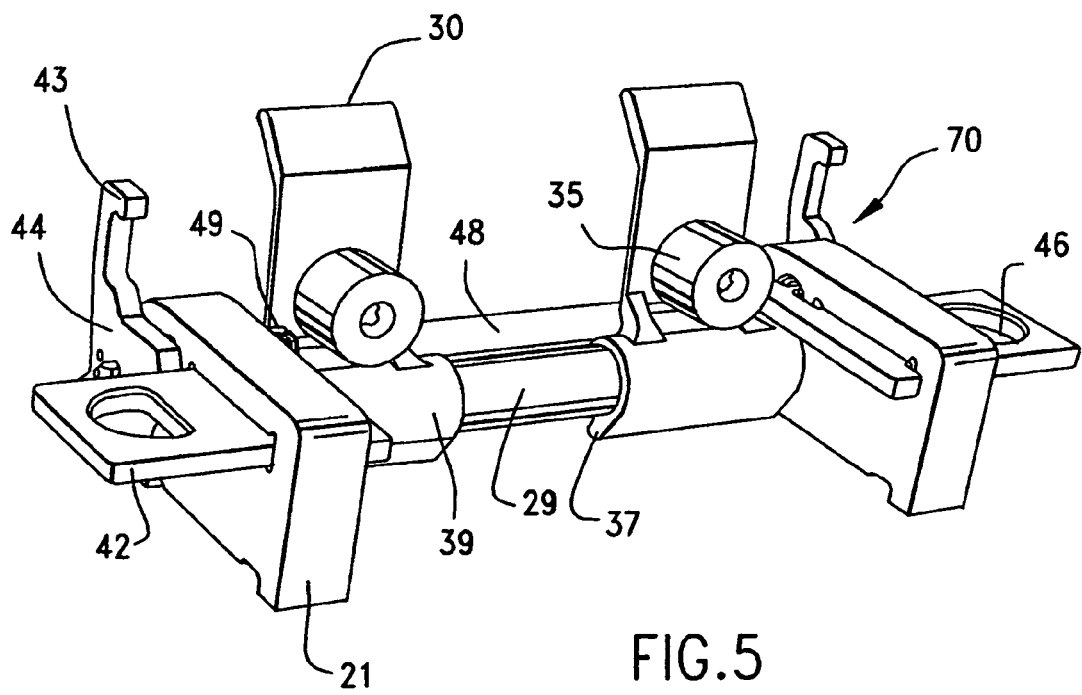
FIG. 5 is a perspective view of a locking compression assembly.
Figure 6:
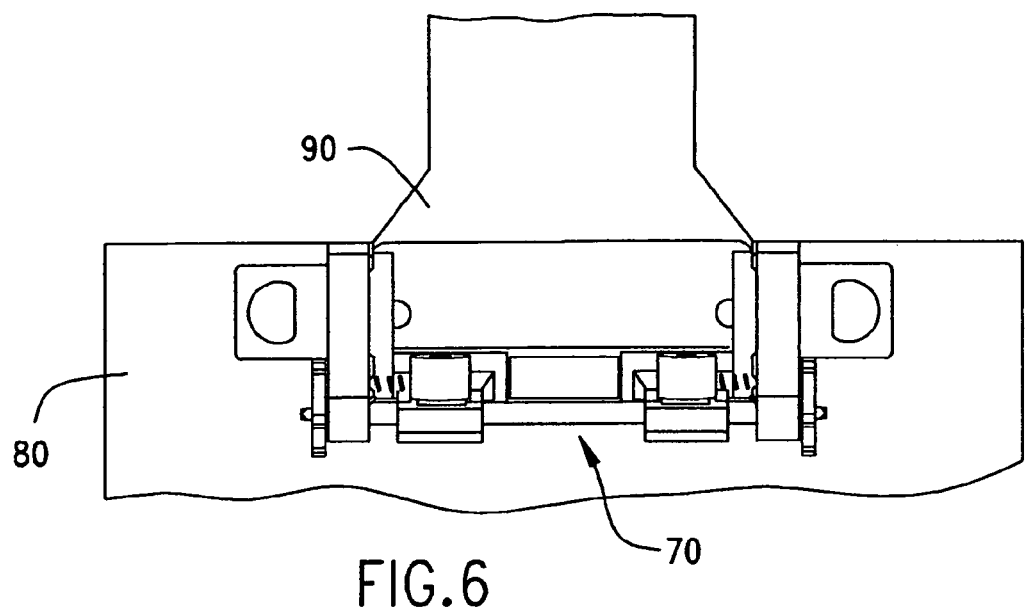
FIG. 6 is a top plan view of a mated compression connector assembly in the open and unlocked position.
Figure 7:
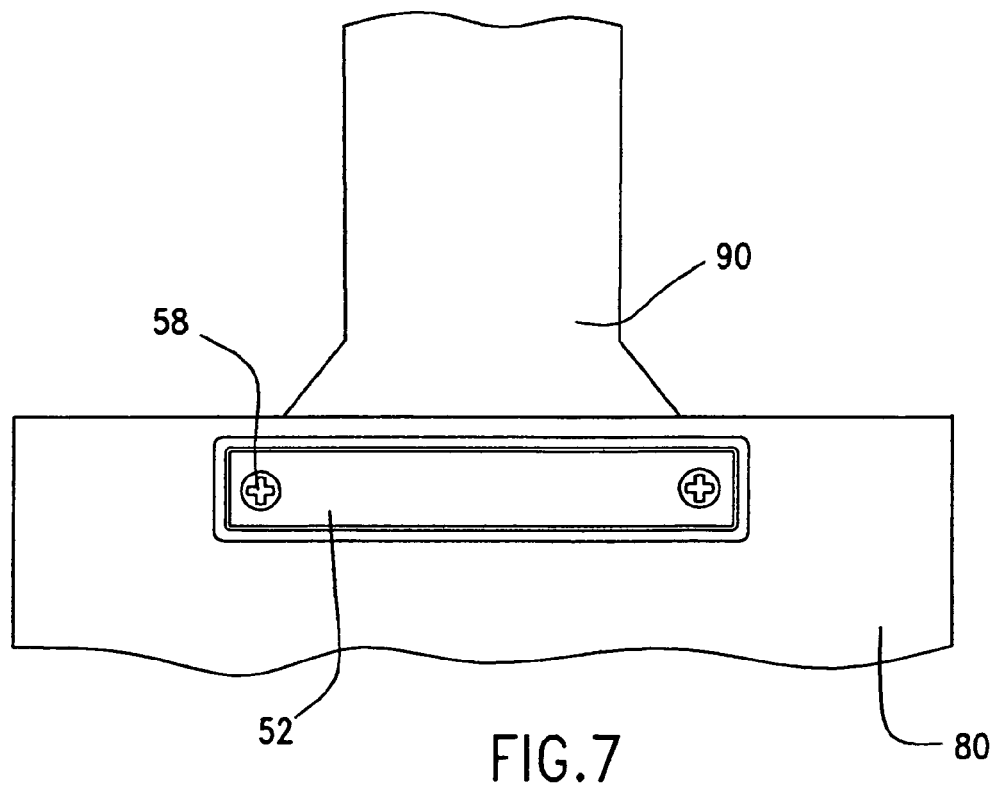
FIG. 7 is a bottom plan view of the mated compression connector assembly of FIG. 6.

As illustrated in FIG. 5, the compression assembly 20 and the locking assembly 40 are combined into the locking compression assembly 70. This embodiment includes pairs of components, as now described. Each end of the lever stop rod 48 is slidably received by an opening 23 in each of the end blocks 21 and then fixedly received by the swing locks 44. Each end of the compression lever rod 29 is fixedly received in the bore 22 in each of the end blocks 21. The locking compression assembly 70 is an integrated assembly that is resistant to twisting or pulling apart.

As seen in FIG. 4, mounting assembly 50 typically includes a backer plate or stiffener 52 that is positioned on the printed circuit board 80 on the side opposite to the compression assembly 20 (FIG. 1). The backer plate 52 is comprised of alignment pins 54 and fastener bores 56, as seen in FIG. 4A. The backer plate 52 and the alignment pins 54 are made of a rigid material, such as metal for example and can be formed by any standard manufacturing process such as molding, casting, machining or stamping. In one embodiment, the backer plate 52 and the alignment pins 54 are separate components and are stamped from steel, such as industry standard C4140 cold rolled steel. In the illustrated embodiment, the backer plate 52 and the alignment pins 54 are a unitary zinc die cast component. The fastener bores 56 can be smooth bored to slidably receive fasteners 58 or threaded to threadably receive the fasteners 58. In this example, the fastener bores 56 are threaded and undercut to prevent the fasteners 58 from backing completely out and loosening or becoming separated from the backer plate 52. Further, in this example the fasteners 58 can be industry standard #2-56 threaded screws.

Figure 4D:
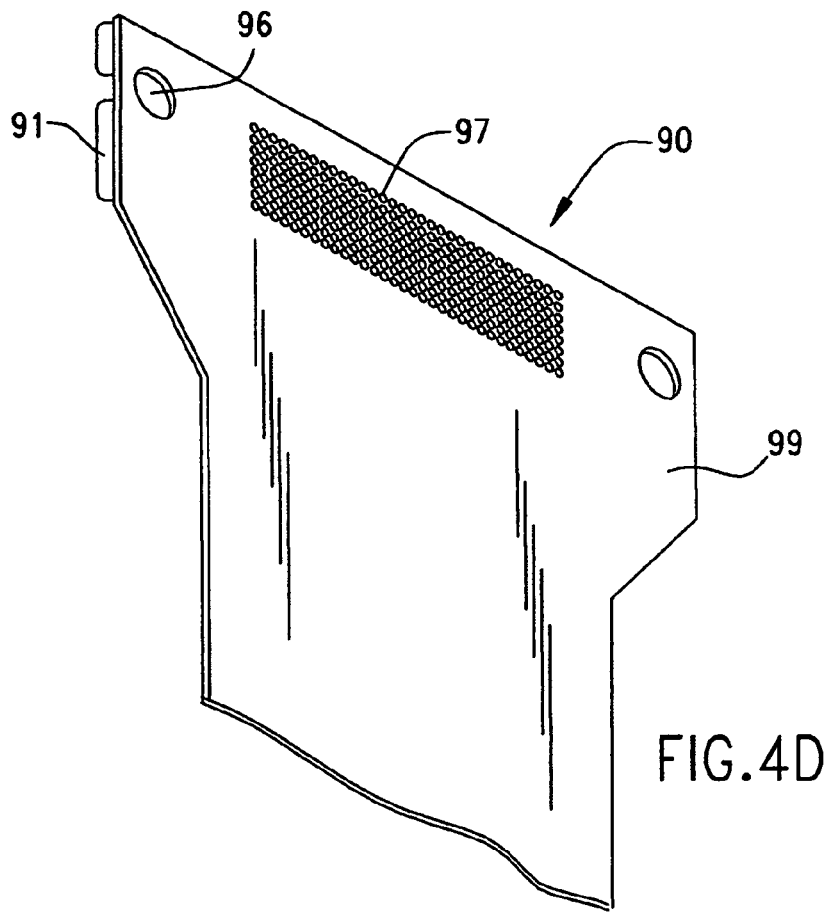
FIG. 4D is a perspective view of a cut away portion of a flexible circuit assembly.

The mounting assembly 50 typically further includes an interposer 55 with open space 61, 62 on either side as seen in FIG. 4. The interposer 55 is comprised of arrays of contacts 57, 57a (FIG. 4) and pin bores 59. In this embodiment, the array of contacts 57 protrudes from the interposer 55 into open space 61 and is aligned with an array of contact pads 87 on the printed circuit board 80 (FIG. 4C). The array of contacts 57a protrudes from the interposer 55 into open space 62 and, in this arrangement is aligned with an array of contact pads 97 on the circuitry component 90 (FIG. 4D). For example, the circuitry component 90 can be a flexible circuit, printed circuit board or a flexible cable, alone or in combination with a hardboard. In this illustration, the circuitry component is comprised of a copper flexible cable 99 and a hardboard 91 formed of a rigid material such as FR4. The hardboard 91 typically is bonded to the flexible cable 99 with pressure sensitive adhesive. The interposer 55 is made of a rigid material, such as metal for example. In this embodiment, the interposer 55 is a copper alloy HD&S PC Beam Interposer from Neoconix. The pin bores 59 slidably receive the alignment pins 54 of the backer plate 52.

Assembly of the compression connection assembly 10 as illustrated in FIG. 1 typically is carried out as follows. The alignment pins 54 of the backer plate 52 are inserted through pin bores 89 on a first side of the mounting circuitry component 80, which in this example is a printed circuit board. The fasteners 58 are simultaneously inserted through fastener bores 86 of the first side of the printed circuit board 80. The interposer 55 is placed on a second side of the printed circuit board 80 and the alignment pins 54 are inserted through the pin bores 59 of the interposer 55. At this point, the printed circuit board 80 occupies a portion of open space 61 and is sandwiched between the backer plate 52 and the interposer 55.

Figure 12:
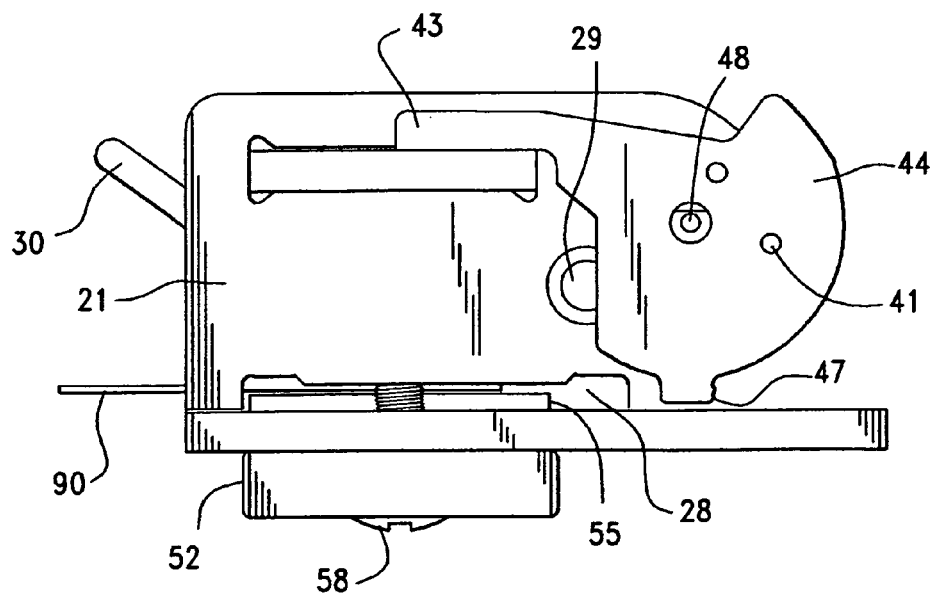
FIG. 12 is a side elevation view of the mated compression connector assembly of FIG. 10.
Figure 12A:
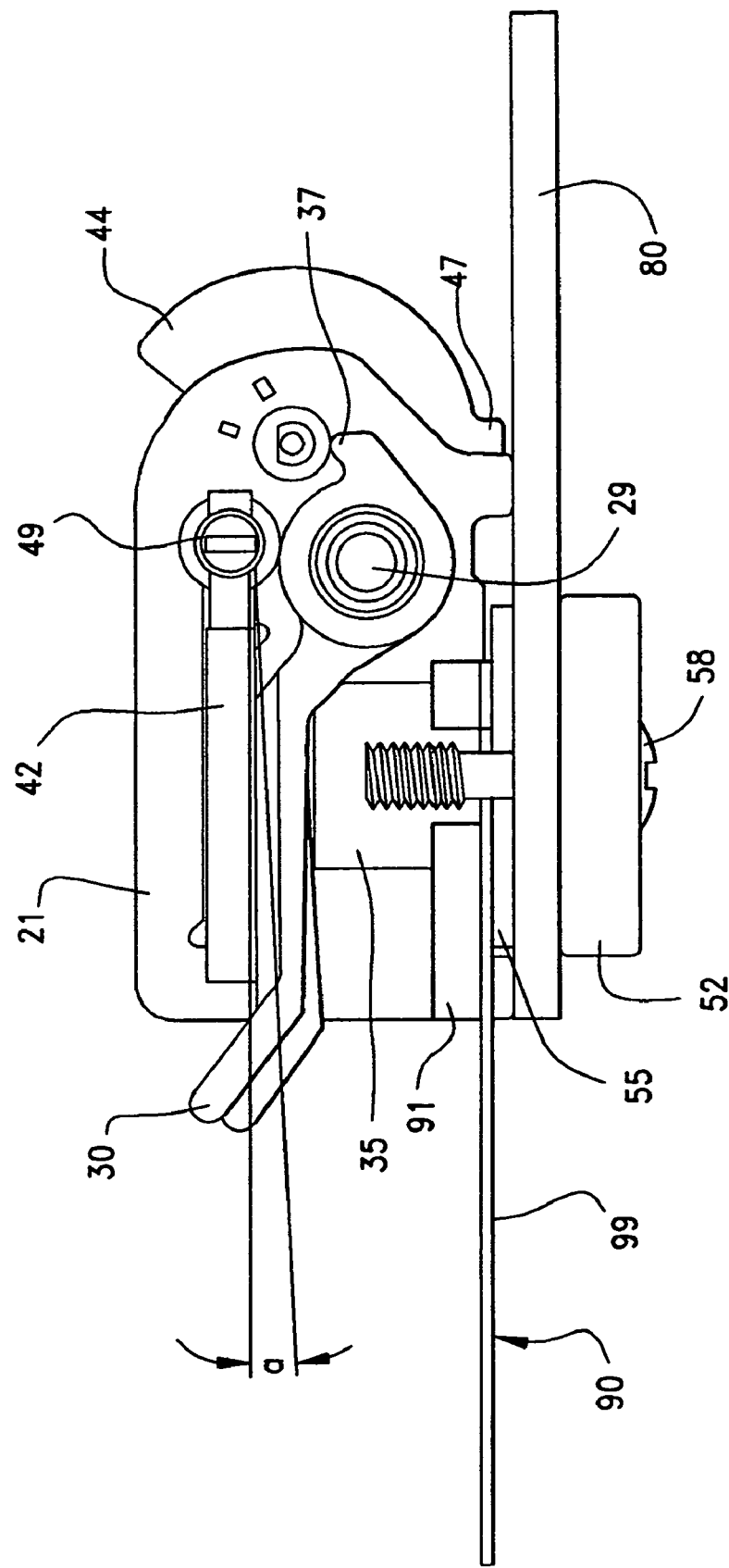
FIG. 12A is a cut away view of the mated compression connector assembly of FIG. 12.

The locking compression assembly 70 is then placed on the front side of the mounting circuitry component, such as printed circuit board 80, such that the fasteners 58 are received in the fastener receiving bores 27 of the end blocks 21. The fasteners 58 are tightened such that the mounting assembly 50 and the locking compression assembly 70 are fixedly attached to the mounting circuitry component, such as printed circuit board 80. In this illustrated example, the printed circuit board is positioned with open space 61 adjacent one face of the interposer 55 which has a 256 circuit size, such that the ends of the interposer 55 are captured between the printed circuit board 80 and the interposer accommodating cavity 28 of the end block 21 (FIG. 12). Alternatively, the interposer 55 could be sized such that the ends of the interposer 55 do not extend under the end block or blocks 21, through the cavity or cavities 28 or therebeyond.

Figure 13A:
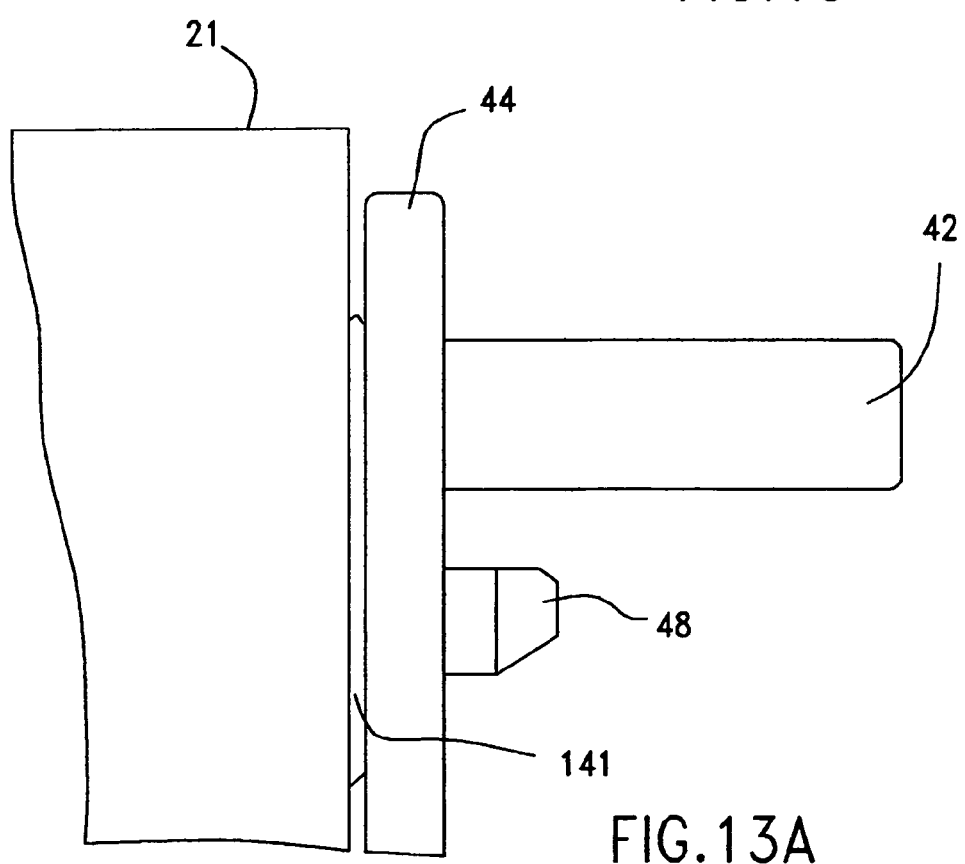
FIG. 13A is a front elevation view of a portion of another embodiment of a mated compression connector assembly.
Figure 13B:
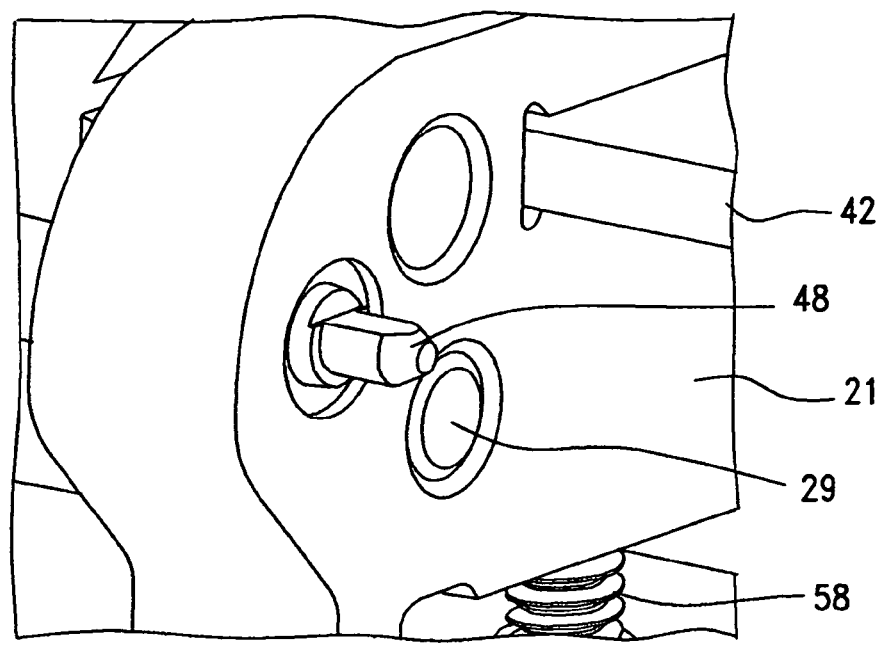
FIG. 13B is a perspective view of a portion of the mated compression connector assembly of FIG. 13A.
Figure 13C:
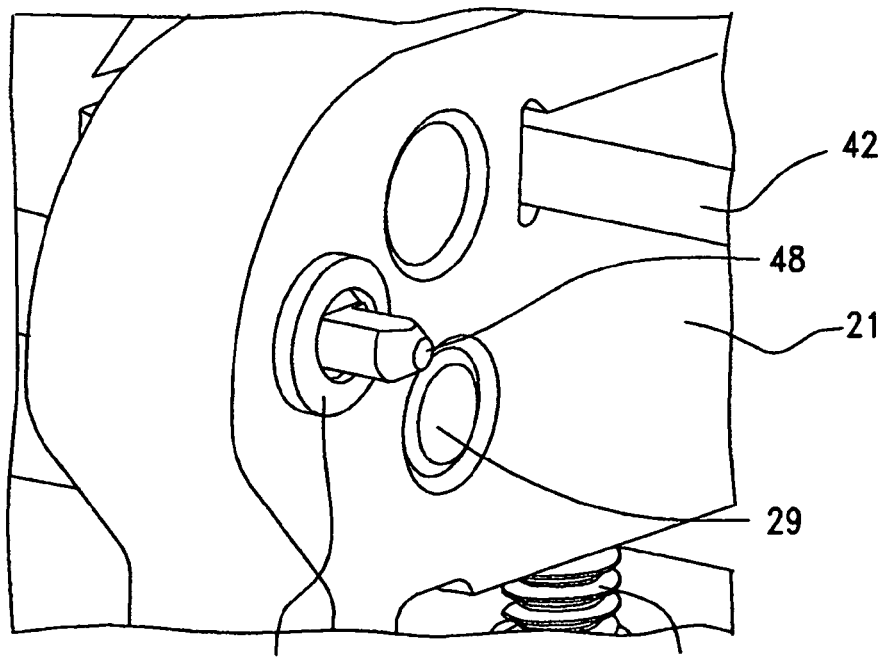
FIG. 13C is another perspective view of a portion of the mated compression connector assembly of FIG. 13A.

Connection of the circuitry component 90 to the compression connection assembly 10 as illustrated in FIG. 10 is as follows. The circuitry component 90 is placed in open space 62 adjacent opposing face of the interposer 55 such that the alignment pins 54 are slidably received by pin bores 96 and the contact pads 97 of the circuitry component 90 engage the contacts 57a of the interposer 55. The compression lever 30 then is rotated such that the compression spring 35 engages the top of the circuitry component 90 which can be a flexible circuit and hardboard or flexible circuit assembly. The compression lever 30 is pressed towards this circuitry component 90 until the stop plate 42 is urged inward to engage the stop 31 on the compression lever 30. In this example, two compression levers 30 are included and the compression levers 30 are engaged one at a time to minimize the mating force required at any specific time. Alternatively, all compression levers 30 could be engaged simultaneously. The swing lock 44 is then rotated such that the latch 43 engages with the latch hole 46 of the stop plate 42 and the locking protrusion 41 is frictionally engaged with the end block 21. Alternatively, a wave washer or O-ring 141 can frictionally engage the end block 21 (FIGS. 13A, 13B and 13C).

As noted above, the compression connection assembly 10 can be varied in size to accommodate circuit sizes of a variety of arrays, such as from 28 contacts to 700 contacts, typically from 80 contacts to 504 contacts. The length of the compression connection assembly 10 can be changed by varying the lengths of the compression lever rod 29, the lever stop rod 48, the backer plate 52 and the interposer 55. All other components of the compression connection assembly remain the same, including the depth. Alternatively, other components can be varied as desired; for example, the depth of the compression connection assembly 10 can be varied, which typically would involve changing the depth of the end block 21, the compression lever 30, the backer plate 52 and the interposer 55.

It will be understood that there are numerous modifications of the illustrated embodiments described above which will be readily apparent to one skilled in the art, such as many variations and modifications of the compression connector assembly and/or its components including combinations of features disclosed herein that are individually disclosed or claimed herein, explicitly including additional combinations of such features, or alternatively other types of contact array connectors. Also, there are many possible variations in the materials and configurations. These modifications and/or combinations fall within the art to which this invention relates and are intended to be within the scope of the claims, which follow.

What is claimed is:

1. A compression connector comprising:
   a compression assembly having a support, at least one compression spring with a mounting member rotatably mounted to the support for movement between an open position and a closed position;
   a mounting assembly attached to said support, said mounting assembly having an open space that is sized and shaped to receive at least two circuitry components each having an array of contacts, at least some of said contacts of one said circuitry component engaging at least some of said contacts of said other circuitry component when the circuitry components are mounted within said open space of said mounting assembly; and a locking assembly of the compression assembly, said locking assembly having at least one stop plate movably received by said support for selective engagement with said compression spring mounting member during movement between an unlocked position and a locked position when said mounting member is in said closed position.

2. The compression connector according to claim 1, wherein one of said circuitry components is a printed circuit board.

3. The compression connector according to claim 1, wherein said compression assembly further comprises a first rod that secures the mounting member to said support.

4. The compression connector according to claim 1, wherein said compression spring has a height and a diameter, and a ratio of said height to said diameter is between 0.3 and 1.

5. The compression connector according to claim 1, wherein said compression spring is comprised of a resilient block of material.

6. The compression connector according to claim 5, wherein said compression spring resilient material is a polyurethane.

7. The compression connector according to claim 1, comprising multiple said compression springs with mounting members are independently movable between the open position and the closed position.

8. The compression connector according to claim 1, further including a plurality of said mounting members and wherein at least one of said mounting members has a portion that engages another of said mounting members upon mounting member rotational movement.

9. The compression connector according to claim 1, wherein said locking assembly further comprises at least one latch member and a second rod that secures the latch member for selective movement into and out of engagement with said stop plate.

10. The compression connector according to claim 1, wherein said stop plate is bias-loaded for sliding movement to the locked position.

11. The compression connector according to claim 10, wherein said stop plate contains at least one open area, and said locking assembly includes a latch member that is received by said open area when the bias-loaded stop plate is at the locked position.

12. The compression connector according to claim 1, wherein said locking assembly includes a latch member having at least one locking protrusion that engages said support.

13. The compression connector according to claim 12, wherein said support includes at least one groove, said groove receiving said at least one locking protrusion through at least a portion of movement of said latch member.

14. The compression connector according to claim 1, wherein said mounting member includes at least one stop protrusion that engages said stop plate when said mounting member is in the closed position.

15. The compression connector according to claim 1, wherein said mounting member is comprised of at least one stop that engages said stop plate, wherein said mounting member is prevented from further rotational movement in at least one radial direction.

16. The compression connector according to claim 1, wherein said mounting member includes at least one stop lip that engages the locking assembly, wherein said mounting member is prevented from further rotational movement in at least one radial direction.

17. The compression connector according to claim 1, wherein said mounting assembly further comprises a backer plate secured to the support to define part of said open space.

18. The compression connector according to claim 1, further comprising an interposer having a bore, wherein said mounting assembly further comprises at least one alignment pin received in said interposer bore.

19. The compression connector according to claim 1, wherein one of said circuitry components includes a flexible circuit component and another said circuitry component includes a printed circuit board.

20. A compression connector comprising:
a compression assembly having at least two supports, at least two compression springs, each with a mounting member rotatably mounted to the supports for movement between an open position and a closed position, wherein each compression spring is adapted to compressively engage a circuitry component of a circuitry assembly including circuitry components having an interposer therebetween;
a mounting assembly attached to said support, said mounting assembly having an open space that is sized and shaped to receive at least two circuitry components each having an array of contacts, at least some of said contacts of one said circuitry component engaging at least some of said contacts of another said circuitry component when the circuitry components are mounted within said open space of said mounting assembly; and
a locking assembly of the compression assembly, said locking assembly having at least two stop plates movably received by said supports between a locked position and an unlocked position, wherein said stop plates are bias-loaded to said locked position in engagement with said mounting members when said mounting members are in said closed position.

21. The compression connector of claim 20, wherein each compression spring is comprised of a resilient block of material.

22. The compression connector of claim 20, wherein said bias-loaded stop plate contains at least one open area, and said locking assembly includes a latch member that is received by said open area when the bias-loaded stop plate is in engagement with said compressor spring mounting members.

23. The compression connector of claim 20, wherein said mounting assembly further comprises a backer plate secured to the support to define part of said open space, and further comprising an interposer having a bore, wherein said mounting assembly further comprises at least one alignment pin received in said interposer bore.

24. The compression connector of claim 20, wherein one of said circuitry components includes a flexible circuit component, and another said circuitry component includes a printed circuit board.

25. A compression connector comprising:
a compression assembly having first and second levers mounted to a first rod, a first polyurethane compression spring mounted to said first lever, a second polyurethane compression spring mounted to said second lever, a first end of said first rod press fit to a first housing and a second end of said first rod press fit to a second housing;
a locking assembly having first and second latch members fixedly attached to a second rod, a first stop plate movably received by said first housing, a second stop plate movably received by said second housing, a first biasing member received through a bore in said first housing, a first end of said first biasing member engaged by said first stop plate, a second end of said first biasing member engaged by said first latch member, a second biasing member received through a bore in said second housing, a first end of said second biasing member engaged by said second stop plate, a second end of said second biasing member engaged by said second latch member, a first end of said second rod rotatably engaged by said first housing and a second end of said second rod rotatably engaged by said second housing; and a mounting assembly having a stiffener, said stiffener having a first alignment pin located near a first end of said stiffener, a second alignment pin located near a second end of said stiffener, a first fastener located between said first alignment pin and said first end of said stiffener, a second fastener located between said second alignment pin and said second end of said stiffener, and an interposer extending between said first housing and said second housing, said interposer including a pair of pin bores respectively receiving said first alignment pin and said second alignment pin and having contacts located to correspond to contact pads on a printed circuit board and a flexible circuit that are to be connected together, said first fastener connected to said first housing and said second fastener connected to said second housing.

26. A compression connector and circuitry component combination comprising:
   a compression assembly having a support, at least one compression spring with a mounting member rotatably mounted to the support for movement between an open position and a closed position;
   a mounting assembly attached to said support, said mounting assembly having open space and an interposer defining multiple portions of said open space, said interposer having an array of contacts on opposing faces thereof;
   a locking assembly of the compression assembly, said locking assembly having at least one bias-loaded stop plate movably received by said support for engagement with said compression spring mounting member;
   a circuitry component having an array of contacts, at least some of which engage at least some of said array of contacts on one face of said interposer, said circuitry component being within one of said open space portions;
   a mounting circuitry component having an array of contacts, at least some of which engage at least some of said array of contacts on the opposing face of the interposer, said mounting circuitry component being within another of said open space portions;
   said interposer is between said circuitry component and said mounting circuitry component; and
   said compression spring engaging said circuitry component when said mounting member is in said closed position.

27. A method for assembling a compression connector circuit assembly comprising;
   placing a backer plate on a first side of a mounting circuitry component, aligning an alignment pin on the backer plate with a hole in the mounting circuitry component, pushing said alignment pin through said hole such that a surface of the backing plate engages a first surface of the mounting circuitry component;
   placing an interposer on a second side of the mounting circuitry component, aligning the alignment pin with a hole in the interposer, pushing said interposer onto the alignment pin such that a first surface of the interposer engages a second surface of the mounting circuitry component; and
   placing a compression and locking assembly on the second side of the mounting circuitry component, aligning a fastener bore in each of two spaced apart supports of said compression and locking assembly with holes in the mounting circuitry component and the backer plate, inserting a fastener through the holes and securing the fastener within the respective fastener bores in the supports.

28. A method for assembling the compression connector circuit assembly of claim 27 to a circuitry component comprising;
   placing a circuitry component over a second surface of the interposer of the compression connector circuit assembly, aligning the alignment pin with a hole in the circuitry component, pushing the circuitry component onto said alignment pin such that a first surface of the circuit component engages the second surface of the interposer; and
   engaging a compression spring carried by said compression and locking assembly with a second surface of said circuit component.

* * * * *